US009523541B2

(12) United States Patent
Kawaura et al.

(10) Patent No.: US 9,523,541 B2
(45) Date of Patent: Dec. 20, 2016

(54) COOLING FIN STRUCTURE

(75) Inventors: Masanori Kawaura, Ichinomiya (JP);
Hirohito Matsui, Okazaki (JP);
Tadafumi Yoshida, Kasugai (JP)

(73) Assignees: TOYOTA JIDOSHA KABUSHIKI KAISHA, Aichi-ken (JP); NIPPON SOKEN, INC., Aichi-ken (JP)

( * ) Notice: Subject to any disclaimer, the term of this patent is extended or adjusted under 35 U.S.C. 154(b) by 271 days.

(21) Appl. No.: 14/112,328

(22) PCT Filed: Apr. 12, 2012

(86) PCT No.: PCT/IB2012/000728
§ 371 (c)(1),
(2), (4) Date: Dec. 18, 2013

(87) PCT Pub. No.: WO2012/143770
PCT Pub. Date: Oct. 26, 2012

(65) Prior Publication Data
US 2014/0138063 A1  May 22, 2014

(30) Foreign Application Priority Data

Apr. 20, 2011 (JP) ................................. 2011-093857

(51) Int. Cl.
*F28F 13/06* (2006.01)
*F28F 1/40* (2006.01)
(Continued)

(52) U.S. Cl.
CPC ................. *F28F 1/40* (2013.01); *F28F 3/022* (2013.01); *F28F 13/06* (2013.01); *H01L 23/473* (2013.01);
(Continued)

(58) Field of Classification Search
CPC .................................. F28F 3/022; F28F 13/06
See application file for complete search history.

(56) References Cited

U.S. PATENT DOCUMENTS 2,892,618 A * 6/1959 Holm ............................ 165/185
3,524,497 A * 8/1970 Chu et al. .................... 165/80.4
(Continued)

FOREIGN PATENT DOCUMENTS

JP        59215755 A   12/1984
JP     2002-185175 A    6/2002
(Continued)

OTHER PUBLICATIONS

Baumann, Optimized Cooling Systems for High-Power Semiconductor Devices, Apr. 2001.*
(Continued)

*Primary Examiner* — Frantz Jules
*Assistant Examiner* — Nelson Nieves
(74) *Attorney, Agent, or Firm* — Sughrue Mion, PLLC

(57) ABSTRACT

A cooling fin structure used in a cooler for an electric device includes a plurality of pin fins (71) arranged in a zigzag form in a coolant passage (80). Each of the pin fins (71) has a circular portion (72) having a circular cross-section, and irregularly shaped portions (73) provided contiguously on the upstream and downstream sides of the circular portion (72) as viewed in a direction of flow of the coolant. The irregularly shaped portions (73) have an outer peripheral surface (75) that is formed along a circumference (130) having a center at a center point (101) of the circular portion (72) of a pin fin (71, 71B) that is located adjacent to the pin fin (71, 71A) having the irregularly shaped portions (73), in an oblique direction relative to the direction of flow of the coolant.

7 Claims, 4 Drawing Sheets

(51) Int. Cl.
*F28F 3/02* (2006.01)
*H01L 23/473* (2006.01)
*H05K 7/20* (2006.01)

(52) U.S. Cl.
CPC ........ *H05K 7/2039* (2013.01); *H05K 7/20254* (2013.01); *H05K 7/20927* (2013.01); *H01L 2924/0002* (2013.01)

(56) References Cited

U.S. PATENT DOCUMENTS

| | | | |
|---|---|---|---|
| 4,638,858 A * | 1/1987 | Chu | 165/185 |
| 6,039,114 A * | 3/2000 | Becker et al. | 165/170 |
| 7,578,337 B2 * | 8/2009 | Spokoiny et al. | 165/80.4 |
| 7,836,597 B2 * | 11/2010 | Datta et al. | 165/104.33 |
| 7,990,711 B1 * | 8/2011 | Andry et al. | 165/80.4 |
| 2008/0093730 A1 | 4/2008 | Furuta | |

FOREIGN PATENT DOCUMENTS

| | | | |
|---|---|---|---|
| JP | 2003188322 A | 7/2003 |
| JP | 2003-324173 A | 11/2003 |
| JP | 2006229180 A | 8/2006 |
| JP | 2009182215 A | 8/2009 |

OTHER PUBLICATIONS

Heinrich Baumann et al.: "Optimized Cooling Systems for High-Power Semiconductor Devices", IEE Transactions on Industrial Electronics, IEEE Service Center, Piscataway, NJ, USA, vol. 48, No. 2, Apr. 1, 2011, XP011023791, ISSN: 0278-0046.
International Search Report for corresponding International Patent Application No. PCT/IB2012/000728 mailed Nov. 30, 2012.

* cited by examiner

COOLING FIN STRUCTURE

BACKGROUND OF THE INVENTION

1. Field of the Invention

The invention generally relates to a cooling fin structure, and more particularly to a structure of cooling fins arranged in a zigzag form.

2. Description of the Related Art

A cooling fin device that arms at improving the cooling efficiency of cooling fins of a heat sink provided in an electronic device is disclosed in Japanese Patent Application Publication No. 2002-185175 (JP 2002-185175 A). In the cooling fin device disclosed in this publication, the cooling fins are discretely placed like pin-type fins, and have a streamline shape relative to the direction of flow of cooling water.

Also, a cooling device for a semiconductor device as disclosed in Japanese Patent Application Publication No. 2003-324173 (JP 2003-324173 A) arms at efficiently dissipating heat while reducing a pressure loss in a coolant channel. In the cooling device for the semiconductor device as disclosed in this publication, protruding elements shaped like fins are formed such that the length or height of the protruding elements is maximized in a region corresponding to substantially the center of the semiconductor device, and the length of the protruding elements gradually decreases toward the outer side. Each of the protruding elements has a spindle shape in a transverse cross-section.

As disclosed in the above-identified publications, coolers in which pin fins are placed on a coolant passage are used for cooling various types of electronic devices that generate heat. As typical arrangements of the pin fins, the pin fins may be arranged in the form of a matrix, or the pin fins may be arranged in a zigzag form.

Where the pin fins are arranged in a zigzag form, the coolant passes through clearances between pin fins arranged in a row, and is then confronted with another row of pin fins present ahead of the coolant. Therefore, the coolant proceeds while winding toward the opposite sides relative to the direction of flow of the coolant. In this case, the pressure loss in the flow of the coolant that flows in the coolant passage is increased, as compared with the arrangement of pin fins in a matrix form through which the coolant proceeds almost straight. The increase in the pressure loss in the flow of the coolant may result in increase of a load on a motor for supplying the coolant, and reduction of the cooling efficiency with which the electronic device is cooled. In order to improve the cooling efficiency of the electronic device, it is necessary to efficiently transfer heat from the pin fins to the coolant, as well as reducing the pressure loss in the flow of the coolant.

SUMMARY OF THE INVENTION

The invention provides a cooling fin structure used in a cooler in which pin fins are arranged in a zigzag form, wherein a pressure loss in the flow of a coolant is reduced, while the efficiency of heat transfer from the pin fins to the coolant is improved.

A cooling fin structure according to one aspect of the invention is used in a cooler for an electronic device. The cooling fin structure includes a plurality of pin fins arranged in a zigzag form in a coolant passage through which a coolant flows. Each of the pin fins has a circular portion having a circular cross-section, and irregularly shaped portions provided contiguously on the upstream side and downstream side of the circular portion as viewed in a direction of flow of the coolant. The irregularly shaped portions have an outer peripheral surface that is formed along a circumference having a center at a center point of the circular portion of an adjacent one of the pin fins that is located adjacent to the pin fin having the irregularly shaped portions, in an oblique direction relative to the direction of flow of the coolant.

With the cooling fin structure constructed as described above, each of the pin fins is provided with the irregularly shaped portions, whereby the surface area of the pin fin that contacts the coolant, and the cross-sectional area of the pin fin, are increased, as compared with a pin fin that consists solely of a circular portion. As a result, the efficiency with which heat is transferred from the pin fins to the coolant can be improved. Also, the outer peripheral surface of the irregularly shaped portions is shaped along a circumference having a center at a center point of a circular portion of a pin fin located adjacent to the pin fin having the above irregularly shaped portions, in an oblique direction relative to the direction of flow of the coolant. With this configuration, the coolant smoothly flows between the pin fins, and vortex is less likely or unlikely to be generated at the downstream side of the pin fins in the direction of flow of the coolant. Consequently, a pressure loss in the flow of the coolant can be reduced.

In the cooling fin structure according to the above aspect of the invention, when a first pitch between the pin fins located adjacent to each other in an oblique direction relative to the direction of flow of the coolant, as measured in a direction orthogonal to the direction of flow of the coolant, is equal to $R+\frac{1}{2} \times CL$, and a second pitch between the pin fins located adjacent to each other in the oblique direction, as measured in the direction of flow of the coolant, is equal to $3^{1/2}(R+\frac{1}{2} \times CL)$, where R is a radius of the circular portion, and CL is a clearance between the pin fins located adjacent to each other in the direction orthogonal to the direction of flow of the coolant, the outer peripheral surface may be shaped along a circumference having a radius of $R+CL$.

With the cooling fin structure constructed as described above, it is possible to increase the surface area of each pin fin that contacts with the coolant and the cross-sectional area of the pin fin, while keeping the width of the coolant passage formed between the pin fins located adjacent to each other in the oblique direction relative to the direction of flow of the coolant, equal to the above-indicated CL determined in view of clogging of the coolant passage.

In the cooling fin structure according to the above aspect of the invention, each of the irregularly shaped portions may have opposite curved faces formed on opposite sides of a centerline that passes through the center point of the circular portion, contiguously with outer peripheral surfaces of the circular portion, each of the opposite curved faces being provided by the outer peripheral surface formed along the circumference.

In the cooling fin structure according to the above aspect of the invention, the irregularly shaped portions of each of the pin fins may include an upstream end point located at an upstream end of the pin fin having the irregularly shaped portions, as viewed in the direction of flow of the coolant, and a downstream end point located at a downstream end of the pin fin as viewed in the direction of flow of the coolant. The pin fins located adjacent to each other in an oblique direction relative to the direction of flow of the coolant may be positioned such that the downstream end point of the irregularly shaped portions of the pin fin located on the upstream side is located downstream of the upstream end point of the irregularly shaped portions of the pin fin located on the downstream side, as viewed in the direction of flow of the coolant.

In the cooling fin structure according to the above aspect of the invention, the irregularly shaped portion located on the upstream side of the circular portion and the irregularly shaped portion located on the downstream side of the circular portion may be symmetric with respect to the center point of the circular portion.

A cooling fin structure according to another aspect of the invention is used in a cooler for an electronic device. The cooling fin structure includes a plurality of pin fins arranged in a zigzag form in a coolant passage through which a coolant flows. Each of the pin fins has a circular portion having a circular cross-section, and irregularly shaped portions provided contiguously on the upstream side and downstream side of the circular portion as viewed in a direction of flow of the coolant. Each of the irregularly shaped portions is formed with outer peripheral surfaces that are curved into a concave shape as viewed from a center point of the circular portion, at opposite sides of a straight line that passes through the center point of the circular portion in the direction of flow of the coolant.

With the cooling fin structure constructed as described above, each of the pin fins is provided with the irregularly shaped portions, whereby the surface area of the pin fin that contacts the coolant, and the cross-sectional area of the pin fin, are increased, as compared with a pin fin that consists solely of a circular portion. As a result, the efficiency with which heat is transferred from the pin fins to the coolant can be improved. Also, the outer peripheral surfaces of each irregularly shaped portion are curved into a concave shape as viewed from the center point of the circular portion, at the opposite sides of the straight line that passes through the center point of the circular portion in the direction of flow of the coolant. With this configuration, the coolant passage is formed between the pin fins located adjacent to each other in an oblique direction relative to the direction of flow of the coolant, along a path of the coolant that proceeds while winding between the pin fins arranged in a zigzag form. Consequently, the coolant flows smoothly, and the pressure loss in the flow of the coolant can be reduced.

In the cooling fin structure according to the above aspect of the invention, the irregularly shaped portions of each of the pin fins may include an upstream end point located at an upstream end of the pin fin having the irregularly shaped portions, as viewed in the direction of flow of the coolant, and a downstream end point located at a downstream end of the pin fin as viewed in the direction of flow of the coolant. The pin fins located adjacent to each other in an oblique direction relative to the direction of flow of the coolant may be positioned such that the downstream end point of the irregularly shaped portions of the pin fin located on the upstream side is located downstream of the upstream end point of the irregularly shaped portions of the pin fin located on the downstream side, as viewed in the direction of flow of the coolant.

With the cooling fin structure constructed as described above, the surface area of each pin fin that contacts the coolant, and the cross-sectional area of the pin fin, can be further increased. Also, the length of the coolant passage formed between the pin fins located adjacent to each other in an oblique direction relative to the direction of flow of the coolant is increased. Therefore, the efficiency of heat transfer from the pin fins to the coolant can be more effectively improved, and the pressure loss in the flow of the coolant can be more effectively reduced.

In the cooling fin structure according to the above aspect of the invention, the irregularly shaped portion located on the upstream side of the circular portion and the irregularly shaped portion located on the downstream side of the circular portion may be symmetric with respect to the center point of the circular portion.

In the cooling fin structure according to the above aspect of the invention, the irregularly shaped portions of each of the pin fins may include an upstream end point located at an upstream end of the pin fin having the irregularly shaped portions, as viewed in the direction of flow of the coolant, and a downstream end point located at a downstream end of the pin fin as viewed in the direction of flow of the coolant. The outer peripheral surfaces of each of the irregularly shaped portions may intersect with each other at an acute angle at the upstream end point and the downstream end point.

As explained above, according to the invention, the cooling fin structure in which the pressure loss in the flow of the coolant is reduced while the efficiency of heat transfer from the pin fins to the coolant is improved can be provided in the cooler in which the pin fins are arranged in a zigzag form.

BRIEF DESCRIPTION OF THE DRAWINGS

Features, advantages, and technical and industrial significance of an exemplary embodiment of the invention will be described below with reference to the accompanying drawings, in which like numerals denote like elements, and wherein.

DETAILED DESCRIPTION OF EMBODIMENTS

Figure 1:
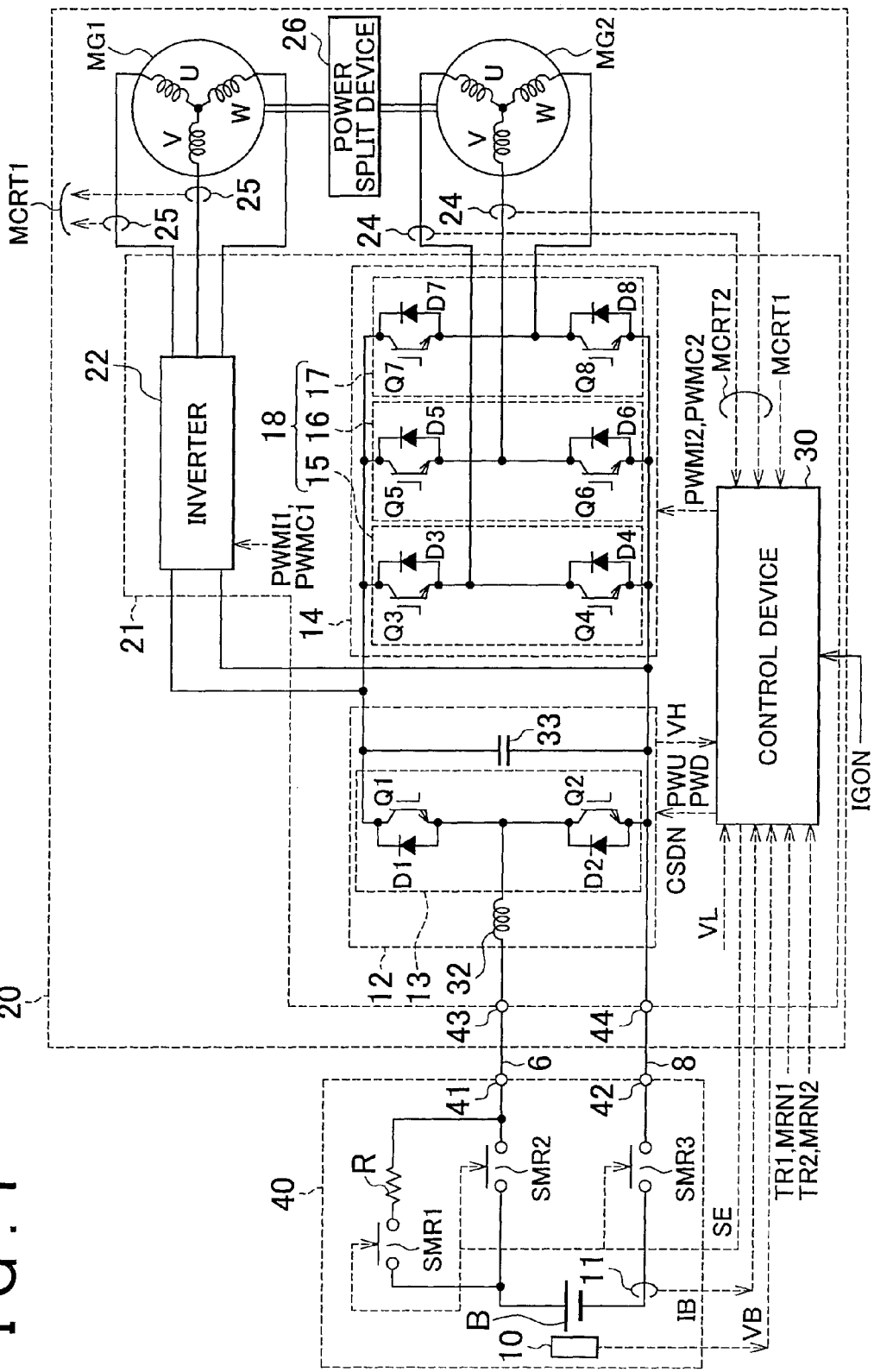
FIG. 1 is a circuit diagram showing the configuration of a system concerning motor-generator control of a hybrid vehicle.

One embodiment of the invention will be described with reference to the drawings. In the drawings that will be referred to in the following description, the same reference numerals are assigned to the same or corresponding members or elements.

FIG. 1 is a circuit diagram showing the configuration of a system concerning motor-generator control of a hybrid vehicle. A cooling fin structure according to one embodiment of the invention is used in a cooler for a power control unit (PCT) installed on the hybrid vehicle. Referring to FIG. 1, the motor-generator control of the hybrid vehicle will be described.

The hybrid vehicle uses an internal combustion engine, such as a gasoline engine or a diesel engine, and motors to which electric power is supplied from a secondary battery capable of charging and discharging, as power sources.

The hybrid vehicle has a battery unit 40, a vehicular drive unit 20, and an engine (not shown). The vehicular drive unit 20 has motor-generators MG1, MG2, a power split device 26 that distributes power among the engine (not shown) and the motor-generators MG1, MG2, and a power control unit 21 that controls the motor-generators MG1, MG2.

The motor-generator MG1 mainly functions as a generator, and is operable to generate electric power using the output of the engine. The motor-generator MG1 also operates as a starter when the engine is started. The motor-generator MG2 mainly functions as a motor, and is operable to boost the output of the engine so as to increase the driving force. Also, the motor-generator MG2 generates electric power during regenerative braking, so as to charge a battery B.

The battery unit 40 is provided with terminals 41, 42. The PCU 21 is provided with DC terminals 43, 44. The terminal 41 and the DC terminal 43 are electrically connected to each other by a cable 6, and the terminal 42 and the DC terminal 44 are electrically connected to each other by a cable 8.

The battery unit 40 has the battery B, a system main relay SMR2 connected between the positive electrode of the battery B and the terminal 41, a system main relay SMR3 connected between the negative electrode of the battery B and the terminal 42, and a system main relay SMR1 and a load-limiting resistor R which are connected in series between the positive electrode of the battery 13 and the terminal 41. The conduction/non-conduction states of the system main relays SMR1-SMR3 are controlled according to a control signal SE supplied from a control device 30 which will be described later.

The battery unit 40 has a voltage sensor 10 that measures the voltage VB between the terminals of the battery B, and a current sensor 11 that detects the current IB that passes through the battery B. As the battery B, a secondary battery, such as a nickel-metal hydride (NiMH) battery or a lithium-ion battery, a fuel cell, or the like, may be used. A capacitor, such as an electric double layer capacitor, having a large capacity may be used as an electric storage device, in place of the battery B.

The power control unit 21 has inverters 22, 14 corresponding to the motor-generators MG1, MG2, respectively, a step-up converter 12 provided in common for the inverters 22, 14, and the control device 30.

The step-up converter 12 boosts the voltage between the DC terminals 43, 44. The step-up converter 12 has a reactor 32 connected at one end to the terminal 43, a boosting IPM (Intelligent Power Module) 13, and a smoothing capacitor 33. The boosting IPM 13 has IGBTs Q1, Q2 connected in series between the output terminals of the step-up converter 12 that generates a voltage VH after boosting, and diodes D1, D2 each of which is connected in parallel with a corresponding one of the IGBTs Q1, Q2. The smoothing capacitor 33 smoothes the voltage boosted by the step-up converter 12.

The other end of the reactor 32 is connected to an emitter of the IGBT Q1 and a collector of the IGBT Q2. The cathode of the diode D1 is connected to a collector of the IGBT Q1, and the anode of the diode D1 is connected to the emitter of the IGBT Q1. The cathode of the diode D2 is connected to the collector, of the IGBT Q2, and the anode of the diode D2 is connected to an emitter of the IGBT Q2.

The inverter 14 converts the dc voltage generated by the step-up converter 12 into three-phase alternating current, and delivers the current to the motor-generator MG2 for driving the wheels. The inverter 14 returns electric power generated by the motor-generator MG2 to the step-up converter 12 during regenerative braking. At this time, the step-up converter 12 is controlled by the control device 30 so as to operate as a step-down circuit.

The inverter 14 has a U-phase arm 15, a V-phase arm 16, and a W-phase arm 17, which constitute an IPM 18 for running the vehicle. The U-phase arm 15, V-phase arm 16, and W-phase arm 17 are connected in parallel between the output lines of the step-up converter 12.

The U-phase arm 15 has IGBTs Q3, Q4 connected in series, and diodes D3, D4 connected in parallel with the IGBTs Q3, Q4, respectively. The cathode of the diode D3 is connected to a collector of the IGBT Q3, and the anode of the diode D3 is connected to an emitter of the IGBT Q3. The cathode of the diode D4 is connected to a collector of the IGBT Q4, and the anode of the diode D4 is connected to an emitter of the IGBT Q4.

The V-phase arm 16 has IGBTs Q5, Q6 connected in series, and diodes D5, D6 connected in parallel with the IGBTs Q5, Q6, respectively. The cathode of the diode D5 is connected to a collector of the IGBT Q5, and the anode of the diode D5 is connected to an emitter of the IGBT Q5. The cathode of the diode D6 is connected to a collector of the IGBT Q6, and the anode of the diode D6 is connected to an emitter of the IGBT Q6.

The W-phase arm 17 has IGBTs Q7, Q8 connected in series, and diodes D7, D8 connected in parallel with the IGBTs Q7, Q8, respectively. The cathode of the diode D7 is connected to a collector of the IGBT Q7, and the anode of the diode D7 is connected to an emitter of the IGBT Q7. The cathode of the diode D8 is connected to a collector of the IGBT Q8, and the anode of the diode D8 is connected to an emitter of the IGBT Q8.

An intermediate point of each phase arm is connected to a corresponding phase end of a corresponding phase coil of the motor-generator MG2. Namely, the motor-generator MG2 is a three-phase permanent-magnet synchronous motor, and each of the three coils of U, V and W phases is connected at one end to a neutral point. The other end of the U-phase coil is connected to a node of the IGBTs Q3, Q4. The other end of the V-phase coil is connected to a node of the IGBTs Q5, Q6. The other end of the W-phase coil is connected to a node of the IGBTs Q7, Q8.

The current sensor 25 detects current passing through the motor-generator MG1 as a motor current value MCRT1, and outputs the motor current value MCRT1 to the control device 30. The current sensor 24 detects current passing through the motor-generator MG2 as a motor current value MCRT2, and outputs the motor current value MCRT2 to the control device 30.

The inverter 22 and the inverter 14 are connected in parallel with each other, to the step-up converter 12. The inverter 22 converts the dc voltage generated by the step-up converter 12 into three-phase alternating current, and delivers the current to the motor-generator MG1. The inverter 22 receives the voltage boosted by the step-up converter 12, and drives the motor-generator MG1 in order to start the engine, for example.

Also, the inverter 22 returns electric power generated by the motor-generator MG1 using torque transmitted from the crankshaft of the engine, to the step-up converter 12. At this time, the step-up converter 12 is controlled by the control device 30 so as to operate as a step-down circuit. The internal arrangement of the inverter 22 is substantially identical with that of the inverter 14, and thus will not be described in detail.

The control device 30 receives torque command values TR1, TR2, respective values of motor speeds MRN1, MRN2, voltages VB, VL, VH, and current IB, motor current values MCRT1, MCRT2, and a starting or ignition signal IGON.

In this connection, the torque command value TR1, motor speed MRN1 and motor current value MCRT1 are associated with the motor-generator MG1, and the torque command value TR2, motor speed MRN2 and motor current value MCRT2 are associated with the motor-generator MG2. The voltage VB is a voltage applied to the battery B, and the current IB is a current passing through the battery B. The voltage VL is a voltage measured before boosting of the step-up converter 12, and the voltage VH is a voltage measured after boosting of the step-up converter 12.

The control device 30 generates a control signal PWU as a command to boost the voltage, a control signal PWD as a command to step down the voltage, and a signal CSDN as a command to inhibit operation, to the step-up converter 12.

The control device 30 generates a drive command PWMI2 to convert the dc voltage as the output of the step-up converter 12 into an ac voltage for driving the motor-generator MG2, and a regeneration command PWMC2 to convert the ac voltage developed by the motor-generator MG2 into a dc voltage and return the dc voltage to the step-up converter 12, to the inverter 14. The control device 30 generates a drive command PWMI1 to convert the dc voltage into an ac voltage for driving the motor-generator MG1, and a regeneration command PWMC1 to convert the ac voltage developed by the motor-generator MG1 into a dc voltage and return the dc voltage to the step-up converter 12, to the inverter 22.

Figure 2:
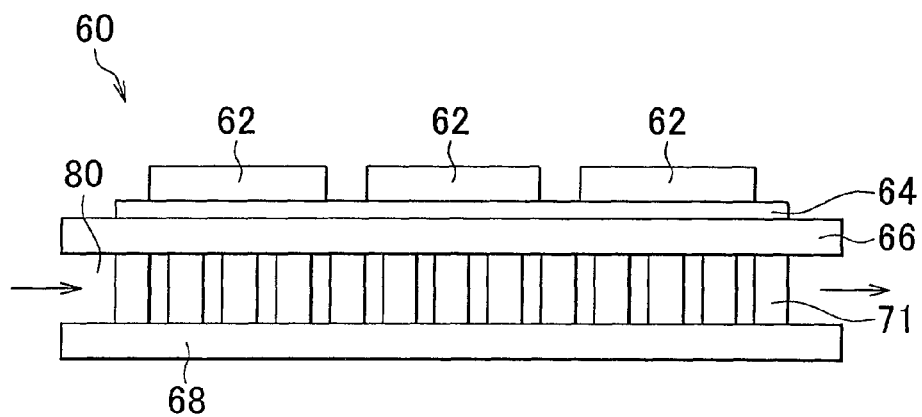
FIG. 2 is a side elevation view showing a cooler for a power control unit in which a cooling fin structure according to one embodiment of the invention is used.
Figure 3:
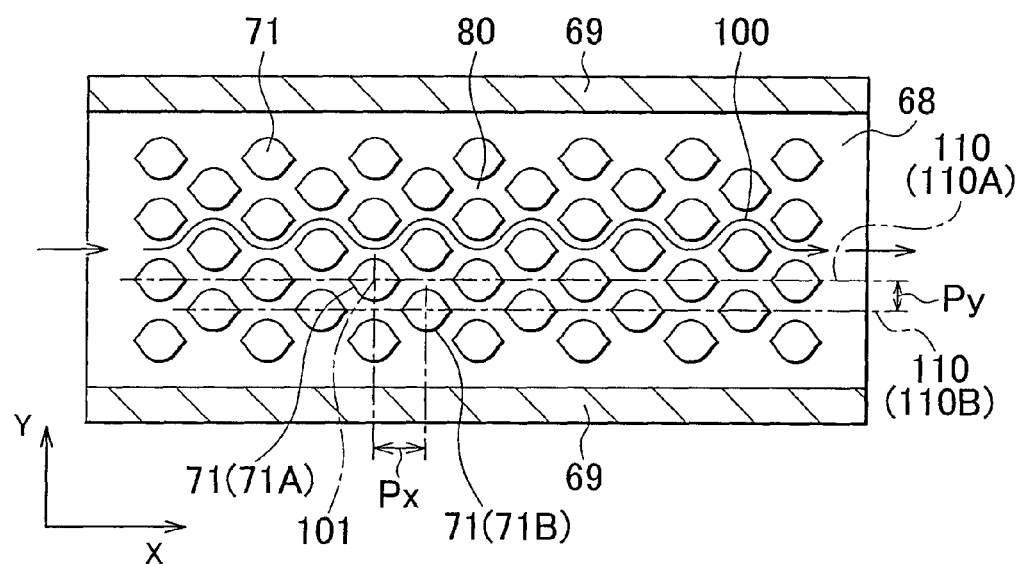
FIG. 3 is a cross-sectional view of the cooler for the power control unit shown in FIG. 2, when viewed in a plane containing the X axis and the Y axis.

Next, the overall structure of the cooler for the power control unit 21 will be described. FIG. 2 is a side elevation view showing the cooler for the power control unit, in which the cooling fin structure according to this embodiment of the invention is used. FIG. 3 is a cross-sectional view showing a planar configuration of the cooler for the power control unit shown in FIG. 2.

Referring to FIG. 2 and FIG. 3, a plurality of semiconductor devices 62 to be cooled are mounted on the cooler 60 for the power control unit. The semiconductor devices 62 constitute the IPM 18 (U-phase arm 15, V-phase arm 16 and W-phase arm 17) for running the vehicle, included in each of the inverters 22, 14 shown in FIG. 1, and the boosting IPM 13 of the step-up converter 12. The semiconductor devices 62 generate heat as the power control unit is driven.

The cooler 60 for the power control unit has an insulating plate 64, a channel top plate 66, a channel bottom plate 68, channel side walls 69, and a plurality of pin fins 71.

The insulating plate 64 is formed of a material having a high electrical insulation property and high thermal conductivity. The insulating plate 64 is formed of a ceramic material. In this embodiment, the insulating plate 64 is formed of aluminum nitride (AlN). The above-indicated plurality of semiconductor devices 62 are joined onto a surface of the insulating plate 64 while being spaced from each other.

The channel top plate 66, channel bottom plate 68, channel side walls 69 and pin fins 71 are formed of a material having high thermal conductivity. In this embodiment, the channel top plate 66, channel bottom plate 68, channel side walls 69 and pin fins 71 are formed of aluminum. The channel top plate 66, channel bottom plate 68, channel side walls 69 and pin fins 71 constitute a heat sink that dissipates heat generated at the semiconductor devices 62, to cooling water (LLC: long life coolant) as a coolant.

As a method of producing the cooler 60, the pin fins 71 may be formed integrally with the channel top plate 66 or the channel bottom plate 68 by die casting with an aluminum die, or the pin fins 71 may be formed singly, and then mounted onto the channel top plate 66 and the channel bottom plate 68.

The channel top plate 66, channel bottom plate 68 and the channel side walls 69 are assembled together from four sides, to form a cooling water passage 80 through which the cooling water flows. The insulating plate 64 to which the semiconductor devices 62 are joined is joined to the channel top plate 66. The pin fins 71 are disposed in the cooling water passage 80. The pin fins 71 are shaped like pins that extend like rods, and are held upright between the channel top plate 66 and the channel bottom plate 68 such that the pin fins 71 are spaced apart from each other.

The semiconductor devices 62 generate heat as the power control unit is driven. The heat generated by the semiconductor devices 62 is transmitted to the pin fins 71 via the insulating plate 64 and the channel top plate 66. On the other hand, the cooling water is supplied from an electric pump (not shown) to the cooling water passage 80, and flows in one direction as indicated by arrows in FIG. 2 and FIG. 3. In the meantime, heat exchange takes place between the cooling water and the pin fins 71, so that the heat generated by the semiconductor devices 62 is dissipated.

In FIG. 3, the X-axis direction denotes a direction in which the cooling water flows in the cooling water passage 80, and the Y-axis direction denotes a direction orthogonal to the direction of flow of the cooling water. The pin fins 71 extend in a direction orthogonal to the X-axis direction and the Y-axis direction, between the channel top plate 66 and the channel bottom plate 68.

The pin fins 71 are arranged in a zigzag form in the cooling water passage 80. Namely, a plurality of pin fins 71 arranged in a line (on a centerline 110A in FIG. 3) in the X-axis direction, and a plurality of pin fins 71 located adjacent to the above-indicated plurality of pin fins 71 and arranged in a line (on a centerline 110B in FIG. 3) in the X-axis direction are shifted from each other in the Y-axis direction. In the following description, the centerline 110A and the centerline 110B will be referred to as "centerline 110" when they are not distinguished from each other.

Where a pin fin 71A as one of the pin fins 71 on the centerline 110A, and a pin fin 71B as one of the pin fins 71 on the centerline 110B, which is located adjacent to the pin fin 71A in an oblique direction (between the X-axis direction and the Y-axis direction) relative to the direction of flow of the cooling water are focused on in FIG. 3, the pin fin 71A and the pin fin 71B are arranged at a pitch of Px as measured in the X-axis direction, and are arranged at a pitch of Py as measured in the Y-axis direction.

In this embodiment, the plurality of pin fins 71 are arranged so as to satisfy a relationship that Px>Py. Furthermore, in this embodiment, the size of the pitch Py is set so that a part of the pin fin 71A lies on the pin fin 71B (i.e., the pin fin 71A overlaps the pin fin 71B) when the pin fin 71A is shifted in the X-axis direction toward the pin fin 71B.

Figure 4:
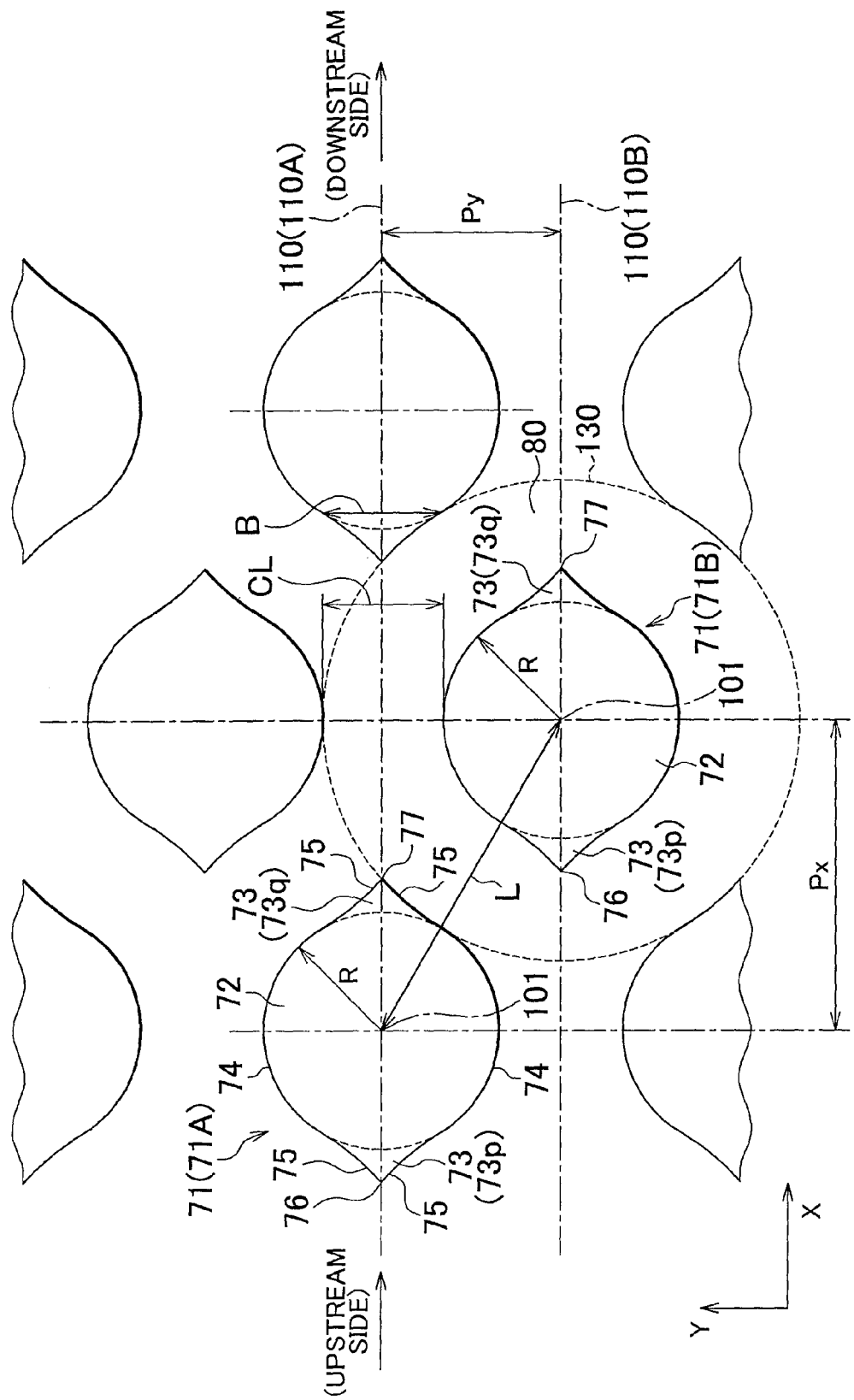
FIG. 4 is a cross-sectional view showing, in enlargement, a part of the cooler for the power control unit shown in FIG. 3.

Next, the configuration of the pin fins 71 used in the cooler 60 for the power control unit as shown in FIG. 2 and FIG. 3 will be described in detail. FIG. 4 is a cross-sectional view showing in enlargement a part of the cooler for the power control unit shown in FIG. 3.

Referring to FIG. 4, each of the pin fins 71 has an irregular, circular cross-section when it is cut in a plane containing the X-axis and the Y-axis (which will be called "X-Y plane"). More specifically, the pin fin 71, when cut in the X-Y plane, has a cross-sectional shape consisting of a circular portion 72, and a curved portion 73p and a curved portion 73q (which will be referred to as "curved portion 73" when they are not particularly distinguished from each other).

The circular portion 72 has a circular shape. The circular portion 72 has a radius R as measured from a center point 101 as a center of the circle. The pitches Px, Py of the pin fins 71 located adjacent to each other in an oblique direction relative to the direction of flow of the cooling water are determined with reference to the center points 101 of the circular portions 72 of the pin fins 71. The circular portion 72 has outer peripheral surfaces 74 that contact the cooling water flowing through the cooling water passage 80. The outer peripheral surfaces 74 are shaped along the circumference of a circle having a center at the center point 101 and the radius R.

The curved portions 73 are provided contiguously on the upstream side and downstream side of the circular portion 72 as viewed in the direction of flow of the cooling water. More specifically, the curved portion 73p is provided contiguously on the upstream side of the circular portion 72 in the direction of flow of the cooling water, and the curved portion 73q is provided contiguously on the downstream side of the circular portion 72 in the direction of flow of the cooling water. The curved portion 73p and the curved portion 73q are symmetric with respect to the center point 101 of the circular portion 72. The curved portion 73p and the curved portion 73q are separated from each other by the circular portion 72 when viewed in the direction of flow of the cooling water.

The curved portion 73p has an upstream end point 76 located at the upstream end of the pin fin 71 as viewed in the direction of flow of the cooling water, and the curved portion 73q has a downstream end point 77 located at the downstream end of the pin fin 71 as viewed in the direction of flow of the cooling water. The upstream end point 76 and the downstream end point 77 are located on the centerline 110 that passes through the center point 101 in the direction of flow of the cooling water. The curved portion 73p is pointed at the upstream end point 76, and the curved portion 73q is pointed at the downstream end point 77. The curved portion 73p is tapered down toward the upstream end point 76, such that the width B of the curved portion 73p as measured in the Y-axis direction increases as a distance from the upstream end point 76 as measured in the X-axis direction increases. The curved portion 73q is tapered down toward the downstream end point 77, such that the width B of the curved portion 73q as measured in the Y-axis direction increases as a distance from the downstream end point 77 as measured in the X-axis direction increases.

While the curved portions 73 are pointed at the upstream end point 76 and the downstream end point 77 in the above-described embodiment, the upstream end point 76 and the downstream end point 77 may be rounded with a small radius, for some reason in terms of the production process for forming the pin fins 71 using a die.

The curved portions 73 have curved faces 75 that contact the cooling water flowing through the cooling water passage 80. More specifically, the curved faces 75 of the curved portions 73 of each pin fin 71 are located at respective positions that are opposed to four pin fins 71 located adjacent to the pin fin 71 having the curved portions 73 in oblique directions relative to the direction of flow of the cooling water.

The curved faces 75 of the curved portion 73p extend from the upstream end point 76 toward the downstream side in the direction of flow of the cooling water, on the opposite sides of the centerline 110, such that the curved faces 75 are contiguous with the outer peripheral surfaces 74 of the circular portion 72. The curved faces 75 of the curved portion 73q extend from the downstream end point 77 toward the upstream side in the direction of flow of the cooling water, on the opposite sides of the centerline 110, such that the curved faces 75 are contiguous with the outer peripheral surfaces 74 of the circular portion 72. The curved faces 75 intersect with each other at the upstream end point 76 or the downstream end point 77 so as to form a corner portion. In this embodiment, the curved faces 75 intersect with each other at the upstream end point 76 or the downstream end point 77 so as to form an acute angle therebetween. The curved face 75 is continuously curved between the upstream end point 76 or the downstream end point 77, and a position at which the curved face 75 continues into the corresponding outer peripheral surface 74 of the circular portion 72. The curved face 75 smoothly continues into the outer peripheral surface 74 of the circular portion 72 while being curved. The curved faces 75 of the curved portion 73p and the curved faces 75 of the curved portion 73q are formed so that the curved faces 75 of one of the curved portions 73p, 73q are superimposed on those of the other of the curved portions 73p, 73q when the above-indicated one of the curved portions 73p, 73q is rotated 180° about the center paint 101 of the circular portion 72. The curved faces 75 of each of the curved portions 73p, 73q are symmetric with respect to the centerline 110.

Each of the curved faces 75 is curved in a concave shape as viewed from the center point 101 of the corresponding circular portion 72. In other words, the curved face 75 has a curved shape that is concaved toward the center point 101 of the circular portion 72. The curved face 75 is curved to be recessed in a direction opposite to that of the outer peripheral surface 74 of the circular portion 72, as viewed from the center point 101 of the circular portion 72. The curved face 75 is curved so that the absolute value of the slope of the curved face 75 in the X-Y plane gradually increases as a distance from the upstream end point 76 or the downstream end point 77 as measured in the X-axis direction increases. The curved face 75 is curved so that the rate of increase of the width B of the curved portion 73 gradually increases as the distance from the upstream end point 76 or the downstream end point 77 as measured in the X-axis direction increases.

Referring to FIG. 3 and FIG. 4, in the cooler 60 for the power control unit in which the pin fins 71 are arranged in a zigzag form, adjacent rows of pin fins 71 arranged to be shifted from each other in the direction orthogonal to the direction of flow of the cooling water appear alternately, in the direction of flow of the cooling water. Therefore, the cooling water flows through the cooling water passage 80 while detouring around the pin fins 71 that appear, ahead, and consequently proceeds while winding on the opposite sides of the centerline 110, as indicated by arrow 100 in FIG. 3. In this case, the cooling water repeatedly collides with the pin fins 71 while flowing through the cooling water passage 80, thus giving rise to a concern about an increase in a pressure loss in the flow of the cooling water.

On the other hand, in the cooling fin structure of this embodiment, each of the pin fins 71 has an irregular, circular cross-section having the circular portion 72 and the curved portions 73. With this configuration, the cooling water passage 80 having side walls provided by the outer peripheral surface 74 and curved face 75 of the pin fin 71A and the outer peripheral surface 74 and curved face 75 of the pin fin 71B is formed between the pin fin 71A and the pin fin 71B located in an oblique direction relative to the direction of flow of the cooling water. In this embodiment in which the curved face 75 is curved in a concave shape as viewed from the center point 101 of the circular portion 72, the cooling water passage 80 is shaped along a path of the cooling water that flows while detouring around the pin fins 71. With this arrangement, the cooling water flows smoothly, and the pressure loss in the cooling water passage 80 can be reduced.

Also, as compared with the case where each of the pin fins 71 consists solely of the circular portion 72, the surface area of the pin fin 71 that contacts the cooling water and the cross-sectional area of the pin fin 71 can be increased. Thus, the efficiency with which heat is transmitted from the pin fins 71 to the cooling water can be improved.

As an example of the cross-sectional shape of the pin fins used in the cooler, a streamline shape having a wing-like cross-section may be proposed. However, in this case, an upstream-side front end portion of the pin fin has a curved, arc-like surface; therefore, the cooling water collides with the front end portion of the pin fin, and then changes its course in such a direction as to detour around the pin fin. It is thus difficult to effectively reduce the pressure loss in the flow of the cooling water. On the other hand, in the cooling fin structure of this embodiment in which the upstream end point 76 of the pin fin 71 has a sharply pointed shape, the course of the cooling water can be smoothly changed.

The plurality of pin fins 71 may also be located such that the downstream end point 77 of the pin fin 71A located on the upstream side in the flow of the cooling water is positioned downstream of the upstream end point 76 of the pin fin 71B located on the downstream side, as viewed in the direction of flow of the cooling water. In this case, the pressure loss in the flow of the cooling water in the cooling water passage 80 can be more effectively reduced, and the efficiency with which heat is transmitted from the pin fins 71 to the cooling water can be more effectively improved.

Referring to FIG. 4, the configuration of the pin fins 71 will be further described. In this embodiment, the curved faces 75 are shaped along a circumference 130. More specifically, where the pin fin 71A and the pin fin 71B located in oblique directions relative to each other with respect to the direction of flow of the cooling water are focused on, one of the curved faced 75 of the pin fin 71A is shaped along the circumference 130 having a center at the center point 101 of the circular portion 72 of the pin fin 71B. Similarly, the remaining curved faces 75 of the pin fin 71A are shaped along circumferences drawn using the circular portions 72 of the other three pin fins 71 located obliquely from the pin fin 71A relative to the direction of flow of the cooling water.

In the cooler using the pin fins, the heat-transfer performance is enhanced as a clearance or pitch between the pin fins is reduced. On the other hand, if the clearance or pitch between the pin fins is excessively reduced, in an actual product, a foreign matter may be stuck or caught in between the pin fins, and may cause clogging of the cooling water passage. Thus, in the cooling fin structure, of this embodiment, the size of the clearance between the pin fins 71 located adjacent to each other in the Y-axis direction is set to a critical limit CL. The critical limit CL is determined in view of the type of the coolant, the velocity of flow of the coolant, the capability of a filter for trapping foreign matters, etc., in an attempt to prevent clogging of the coolant passage. As one example, the critical limit CL is equal to or larger than 0.5 mm.

In this case, the pitch Px in the X-axis direction of the pin fin 71A and the pin fin 71B located in oblique directions relative to each other with respect to the direction of flow of the cooling water is set to $3^{1/2}(R+\frac{1}{2}\times CL)$, and the pitch Py in the Y-axis direction of the pin fin 71A and the pin fin 71B is set to $R+\frac{1}{2}\times CL$, while the radius of the circumference 130 is set to R+CL.

With the above configuration, the cooling water flows smoothly between the pin fins 71, and vortex is less likely or unlikely to be generated around the downstream end points 77 of the pin fins 71. Thus, the pressure loss in the flow of the cooling water in the cooling water passage 80 can be effectively reduced.

Also, in this embodiment, the pitch L between the center points 101 of the pin fin 71A and the pin fin 71B is set to 2R+CL. In this case, the width of the cooling water passage 80 formed between the pin fin 71A and the pin fin 71B is equal to CL. It is thus possible to increase the surface area of the pin fins 71 that contact the cooling water, to the maximum, while keeping the width of the cooling water passage 80 at the critical limit CL determined in view of clogging of the coolant passage.

Figure 5:
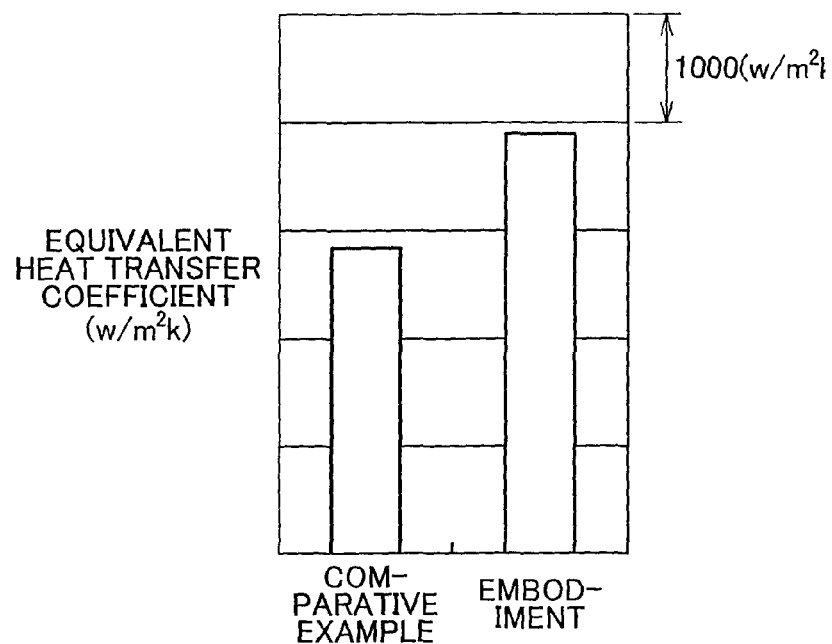
FIG. 5 is a graph comparing the equivalent coefficient of heat transfer from pin fins to cooling water in the cooling fin structure of the embodiment of the invention, with that of a comparative example.
Figure 6:
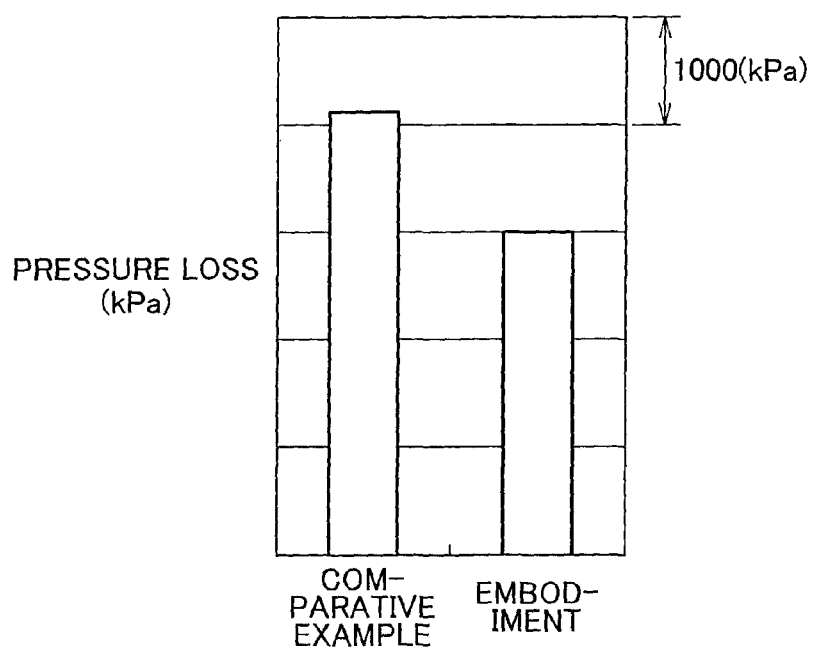
FIG. 6 is a graph comparing a pressure loss in the flow of cooling water in the cooling fin structure of the embodiment of the invention, with that of the comparative example.

FIG. 5 is a graph comparing the equivalent coefficient of heat transfer from the pin fins to the cooling water in the cooling fin structure of this embodiment of the invention, with that of a cooling fin structure of a comparative example. FIG. 6 is a graph comparing a pressure loss in the flow of the cooling water in the cooling fin structure of this embodiment of the invention, with that of the cooling fin structure of the comparative example.

Referring to FIG. 5 and FIG. 6, the pin fins of the embodiment of the invention have the same configuration and arrangement as the pin fins 71 shown in FIG. 3 and FIG. 4 as described above. The pin fins in the comparative example are columnar pin fins each of which consists solely of the circular portion 72 (having the radius of R) of the pin fin 71 as shown in FIG. 4. When the equivalent coefficient of heat transfer from the pin fins to the cooling, water and the pressure loss in the flow of the cooling water were evaluated through a CAE analysis, the equivalent heat transfer coefficient obtained in the embodiment was higher by about 1000 W/m$^2$K than that of the comparative example, and the pressure loss obtained in the embodiment was lower by about 1000 kPa than that of the comparative example.

The construction of the cooling fin structure according to the illustrated embodiment of the invention will be summarized as follows. The cooling fin structure of this embodiment is used in the cooler 60 for the power control unit as an electronic device. The cooling fin structure includes a plurality of pin fins 71 arranged in a zigzag form in the cooling water passage 80 as a coolant passage through which cooling water as a coolant flows. Each of the pin fins 71 has a circular portion 72 having a circular cross-section, and curved portions 73 as irregularly shaped portions provided contiguously on the upstream side and downstream side of the circular portion 72 as viewed in the direction of flow of the cooling water. Each of the curved portions 73 is formed with a curved face 75 as an outer peripheral surface that is curved along a circumference 130 having a center at the center point 101 of the circular portion 72 of the pin fin 71 (71B) located adjacent to the pin fin 71 (71A) having the above-indicated curved portion 73, in an oblique direction relative to the direction of flow of the cooling water.

The construction of the cooling fin structure according to another aspect of the invention will be described. The cooling fin structure of this embodiment is used in the cooler 60 for the power control unit as an electric device. The cooling fin structure includes a plurality of pin fins 71 arranged in a zigzag form in the cooling water passage 80 as a coolant passage through which cooling water as a coolant flows. Each of the pin fins 71 has a circular portion 72 having a circular cross-section, and curved portions 73 as irregularly shaped portions provided contiguously on the upstream side and downstream side of the circular portion 72 as viewed in the direction of flow of the cooling water. Each of the curved portions 73 is formed with curved faces 75 as outer peripheral surfaces, which are curved into a concave shape as viewed from the center point 101 of the circular portion 72, on the opposite sides of the centerline 110 as a straight line that extends from the center point 101 of the circular portion 72 in the direction of flow of the cooling water.

With the cooling fin structure constructed as described above according to the embodiment of the invention, it is possible to reduce the pressure loss in the flow of the cooling water in the cooling water passage 80, while improving the efficiency with which heat is transferred from the pin fins 71 to the cooling water, in the cooler 60 for the power control unit including the pin fins 71 arranged in a zigzag form. Consequently, the semiconductor devices 62 that constitute the power control unit are cooled with improved efficiency.

The present invention may also be applied to coolers for power control units installed on, for example, a fuel cell hybrid vehicle (FCHV) using a fuel cell and a secondary battery as power sources, and an electric vehicle (EV). While the internal combustion engine is driven at an operating point at which the fuel efficiency is optimized in the hybrid vehicle of the illustrated embodiment, the fuel cell is driven at an operating point at which the power generation efficiency is optimized in the fuel cell hybrid vehicle. Also, there is basically no difference in connection with the use of the secondary battery, between the fuel cell hybrid vehicle and the hybrid vehicle of the illustrated embodiment.

While the invention has been described with reference to an exemplary embodiment thereof, it is to be understood that the invention is not limited to the described exemplary embodiment or construction. To the contrary, the invention is intended to cover various modifications and equivalent arrangements. In addition, while the various elements of the exemplary embodiment are shown in various combinations and configurations, other combinations and configurations, including more, less or only a single element, are also within the scope of the invention.

This invention is mainly applied to a cooler for cooling a heat generator, such as a semiconductor device.

The invention claimed is:

1. A cooling fin structure used in a cooler for an electric device, comprising:
    a plurality of pin fins arranged in a zigzag form in a coolant passage through which a coolant flows, wherein:
    each of the pin fins has a circular portion having a circular cross-section, and curved portions provided contiguously on the upstream side and downstream side of the circular portion as viewed in a direction of flow of the coolant;
    the curved portions have an outer peripheral surface that is entirely formed along a circumference having a center at a center point of the circular portion of an adjacent one of the pin fins that is located adjacent to the pin fin having the curved portions, in an oblique direction relative to the direction of flow of the coolant; and
    each of the curved portions has opposite curved faces formed contiguously with outer peripheral surfaces of the circular portion and each of the opposite curved faces is provided by the outer peripheral surface formed along the circumference,
    wherein the opposite curved faces of each of the respective curved portions meets at an end point, so that the opposite curved faces are each continuously curved from the end point to a position at which the curved face continues into the corresponding outer peripheral surface of the circular portion, wherein
    when a first pitch between the pin fins located adjacent to each other in an oblique direction relative to the direction of flow of the coolant, as measured in a direction orthogonal to the direction of flow of the coolant, is equal to $R+\frac{1}{2}\times CL$, and a second pitch between the pin fins located adjacent to each other in the oblique direction, as measured in the direction of flow of the coolant, is equal to $3^{1/2}(R+\frac{1}{2}\times CL)$, where R is a radius of the circular portion, and CL is a clearance between the pin fins located adjacent to each other in the direction orthogonal to the direction of flow of the coolant, the outer peripheral surface is shaped along the circumference having a radius of $R+CL$.

2. The cooling fin structure according to claim 1, wherein the opposite curved faces are formed on opposite sides of a centerline that passes through the center point of the circular portion.

3. The cooling fin structure according to claim 1, wherein:
    the end point of each of the pin fins includes an upstream end point located at an upstream end of the pin fin having the curved portions, as viewed in the direction of flow of the coolant, and a downstream end point located at a downstream end of the pin fin as viewed in the direction of flow of the coolant; and
    the pin fins located adjacent to each other in an oblique direction relative to the direction of flow of the coolant are positioned such that the downstream end point of the curved portions of the pin fin located on the upstream side is located downstream of the upstream end point of the curved portions of the pin fin located on the downstream side, as viewed in the direction of flow of the coolant.

4. The cooling fin structure according to claim 1, wherein the curved portion located on the upstream side of the circular portion and the curved portion located on the downstream side of the circular portion are symmetric with respect to the center point of the circular portion.

5. A cooling fin structure used in a cooler for an electric device, comprising:
    a plurality of pin fins arranged in a zigzag form in a coolant passage through which a coolant flows, wherein:
    each of the pin fins has a circular portion having a circular cross-section, and curved portions provided contiguously on the upstream side and downstream side of the circular portion as viewed in a direction of flow of the coolant; and
    each of the curved portions is formed with outer peripheral surfaces that are curved into a concave shape as viewed from a center point of the circular portion, at opposite sides of a straight line that passes through the center point of the circular portion in the direction of flow of the coolant, wherein:
    the curved portions of each of the pin fins include an upstream end point located at an upstream end of the pin fin having the curved portions, as viewed in the direction of flow of the coolant, and a downstream end point located at a downstream end of the pin fin as viewed in the direction of flow of the coolant; and the pin fins located adjacent to each other in an oblique direction relative to the direction of flow of the coolant are positioned such that the downstream end point of the curved portions of the pin fin located on the upstream side is located downstream of the upstream end point of the curved portions and upstream of the circular portion of the pin fin located on the downstream side, as viewed in the direction of flow of the coolant, wherein when a first pitch between the pin fins located adjacent to each other in an oblique direction relative to the direction of flow of the coolant, as measured in a direction orthogonal to the direction of flow of the coolant, is equal to $R+\frac{1}{2} \times CL$, and a second pitch between the pin fins located adjacent to each other in the oblique direction, as measured in the direction of flow of the coolant, is equal to $3(R+\frac{1}{2} \times CL)$, where R is a radius of the circular portion, and CL is a clearance between the pin fins located adjacent to each other in the direction orthogonal to the direction of flow of the coolant, the outer peripheral surface is shaped along the circumference having a radius of $R+CL$.

6. The cooling fin structure according to claim 5, wherein the curved portion located on the upstream side of the circular portion and the curved portion located on the downstream side of the circular portion are symmetric with respect to the center point of the circular portion.

7. The cooling fin structure according to claim 5, wherein:
the outer peripheral surfaces of each of the curved portions intersect with each other at an acute angle at the upstream end point and the downstream end point.

\* \* \* \* \*